United States Patent
Lee et al.

(10) Patent No.: US 11,594,708 B2
(45) Date of Patent: Feb. 28, 2023

(54) DISPLAY DEVICE

(71) Applicant: Samsung Display Co., Ltd., Yongin-Si (KR)

(72) Inventors: Jungil Lee, Seoul (KR); Sungsang Ahn, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 302 days.

(21) Appl. No.: 16/815,216

(22) Filed: Mar. 11, 2020

(65) Prior Publication Data

US 2020/0313112 A1    Oct. 1, 2020

(30) Foreign Application Priority Data

Mar. 26, 2019    (KR) .......................... 10-2019-0033978

(51) Int. Cl.
*G09F 9/30* (2006.01)
*H01L 51/52* (2006.01)
(Continued)

(52) U.S. Cl.
CPC .......... *H01L 51/529* (2013.01); *G06F 1/1616* (2013.01); *G06F 1/1675* (2013.01); *G09F 9/301* (2013.01); *H01L 27/32* (2013.01)

(58) Field of Classification Search
CPC ... H01L 51/529; H01L 27/32; H01L 27/3244; H01L 51/5237; H01L 51/50; H01L 2251/5338; G06F 1/1616; G06F 1/1675; G06F 1/1652; G06F 1/20; G06F 1/203; G06F 2200/1612; G06F 1/1601; G09F 9/301; G09F 9/33; H05K 7/20509
See application file for complete search history.

(56) References Cited

U.S. PATENT DOCUMENTS

2006/0050196 A1* 3/2006 Lee .................. G02F 1/133308
                                                                    349/58
2006/0274022 A1* 12/2006 Ohashi ................. G02F 1/1309
                                                                    345/102
(Continued)

FOREIGN PATENT DOCUMENTS

JP    2013-535706    9/2013
KR    10-2009-0124095    12/2009
(Continued)

*Primary Examiner* — S M Sohel Imtiaz
(74) *Attorney, Agent, or Firm* — F. Chau & Associates, LLC

(57) ABSTRACT

A display device includes first and second sidewall portions and a display module disposed therebetween that is folded with respect to an axis. A moving portion is connected to a first side of the display module and is disposed between the first sidewall portion and the second sidewall portion in a non-expanded mode. A link portion is connected to a second side of the display module. A driving integrated circuit is disposed below the display module and includes a heat discharge plate disposed thereon. The moving portion is configured to move in the first direction to bring the display device into an expansion mode in which the moving portion is farther displaced from the second side of the display module and the link portion is configured to expand in the first direction so that a portion of the link portion overlaps with the heat discharge plate.

20 Claims, 18 Drawing Sheets

(51) Int. Cl.
  *H01L 27/32*  (2006.01)
  *G06F 1/16*  (2006.01)

(56) References Cited

U.S. PATENT DOCUMENTS

| | | | | |
|---|---|---|---|---|
| 2012/0230051 A1* | 9/2012 | Kim | .................. | G02F 1/133308 362/602 |
| 2013/0058063 A1* | 3/2013 | O'Brien | ................ | G06F 1/1624 361/807 |
| 2014/0247544 A1* | 9/2014 | Ryu | .................... | H05K 5/0017 361/679.01 |
| 2015/0382484 A1* | 12/2015 | Jung | ................... | G09G 3/3225 361/752 |
| 2016/0363960 A1* | 12/2016 | Park | ........................ | G09F 9/301 |
| 2016/0366772 A1* | 12/2016 | Choi | ..................... | G06F 1/1616 |
| 2019/0146586 A1* | 5/2019 | Yamamoto | .............. | G06F 3/016 345/174 |
| 2019/0208649 A1* | 7/2019 | Jeon | ..................... | H05K 5/0226 |
| 2021/0159221 A1* | 5/2021 | Li | ......................... | G06F 1/1601 |

FOREIGN PATENT DOCUMENTS

| | | |
|---|---|---|
| KR | 10-2014-0059274 | 5/2014 |
| KR | 10-2016-0141255 | 12/2016 |
| KR | 10-2016-0148116 | 12/2016 |

\* cited by examiner

DISPLAY DEVICE

CROSS-REFERENCE TO RELATED APPLICATION

This application claims priority under 35 U.S.C. § 119 of Korean Patent Application No. 10-2019-0033978, filed on Mar. 26, 2019, the disclosure of which is incorporated by reference in its entirety herein.

TECHNICAL FIELD

The present disclosure relates to a display device. More particularly, the present disclosure relates to a display device that efficiently discharges heat generated from a driving integrated circuit.

DISCUSSION OF RELATED ART

Numerous electronic devices, such as smart phones, digital cameras, notebook computers, navigation units, and smart televisions, include a display device for displaying an image to a user. The display device generates the image and provides the image on a display screen for viewing by the user.

Technological developments in recent years have resulted in the availability of various types of new display devices. For example, a flexible display device that is foldable or rollable has been developed. The flexible display device is able to be transformed into various shapes and is easy to carry for improved user convenience. The flexible display device includes a flexible display module. The display module is typically housed in a case and may be withdrawn from the case and expanded as needed.

The display device includes a driving integrated circuit to control an operation of the display module. However, when the driving integrated circuit is driven, heat is generated from the driving integrated circuit which may damage parts of the driving integrated circuit.

SUMMARY

The present disclosure provides display device capable of efficiently discharging heat generated from a driving integrated circuit.

In an exemplary embodiment of the present inventive concepts, a display device includes first and second sidewall portions extending in a first direction and arranged in a second direction that crosses the first direction. A display module includes first and second sides arranged in the first direction. The display module is disposed between the first sidewall portion and the second sidewall portion and folded with respect to an axis extending in the second direction. A moving portion is connected to the first side of the display module. The moving portion is disposed between the first sidewall portion and the second sidewall portion when the display device is in a non-expanded mode. A link portion is connected to the second side of the display module. A driving integrated circuit is disposed below the display module. A heat discharge plate is disposed on the driving integrated circuit. The moving portion is configured to move in the first direction to bring the display device into an expansion mode in which the moving portion is farther displaced from the second side of the display module in the first direction than in the non-expanded mode. The link portion is configured to expand in the first direction when the moving portion moves in the first direction so that a portion of the link portion overlaps with the heat discharge plate in the expansion mode.

In an exemplary embodiment of the present inventive concepts, a display device includes a display module having a first side and a second side arranged in the first direction. The display module is folded with respect to an axis extending in a second direction that crosses the first direction. A moving portion is connected to the first side of the display module. A link portion is connected to the second side of the display module. The second side of the display module is located lower than the first side of the display module and the moving portion. The link portion includes a plurality of branch portions extending downward. A driving integrated circuit is disposed under the display module. A heat discharge plate is disposed on the driving integrated circuit. A plurality of protrusion portions is disposed on the heat discharge plate. When the moving portion moves in the first direction, the link portion expands in the first direction so that the branch portions make contact with the protrusion portions.

In an exemplary embodiment of the present inventive concepts, a display device includes a case configured to house a foldable display module. The foldable display module is configured to move in a first direction to bring the display device into an expansion mode in which a first end of the display module is farther displaced from a second end of the display module than when the display device is in a non-expanded mode. A link portion is connected to the second side of the display module. The link portion includes a plurality of branch portions extending downward. A driving integrated circuit is disposed under the foldable display module. A heat discharge plate having protrusion portions is disposed on the driving integrated circuit. The link portion is configured to expand in the first direction when the foldable display module moves in the first direction so that the branch portions make contact with the protrusion portions.

According to the above, the heat discharge plate is disposed on the driving integrated circuit, and the protrusion portions are disposed on the heat discharge plate. Therefore, the heat generated from the driving integrated circuit may be preliminary discharged by the heat discharge plate and the protrusion portions. In addition, the link portion that adjusts the exposed area of the display module includes the branch portions extending downward, and the branch portions make contact with the protrusion portions in the expansion mode in which the exposed area of the display module is expanded. Therefore, the heat generated from the driving integrated circuit may be secondarily discharged by the branch portions and the link portion. Accordingly, the display device may efficiently discharge the heat generated from the driving integrated circuit.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF THE EXEMPLARY EMBODIMENTS

Figure 1:
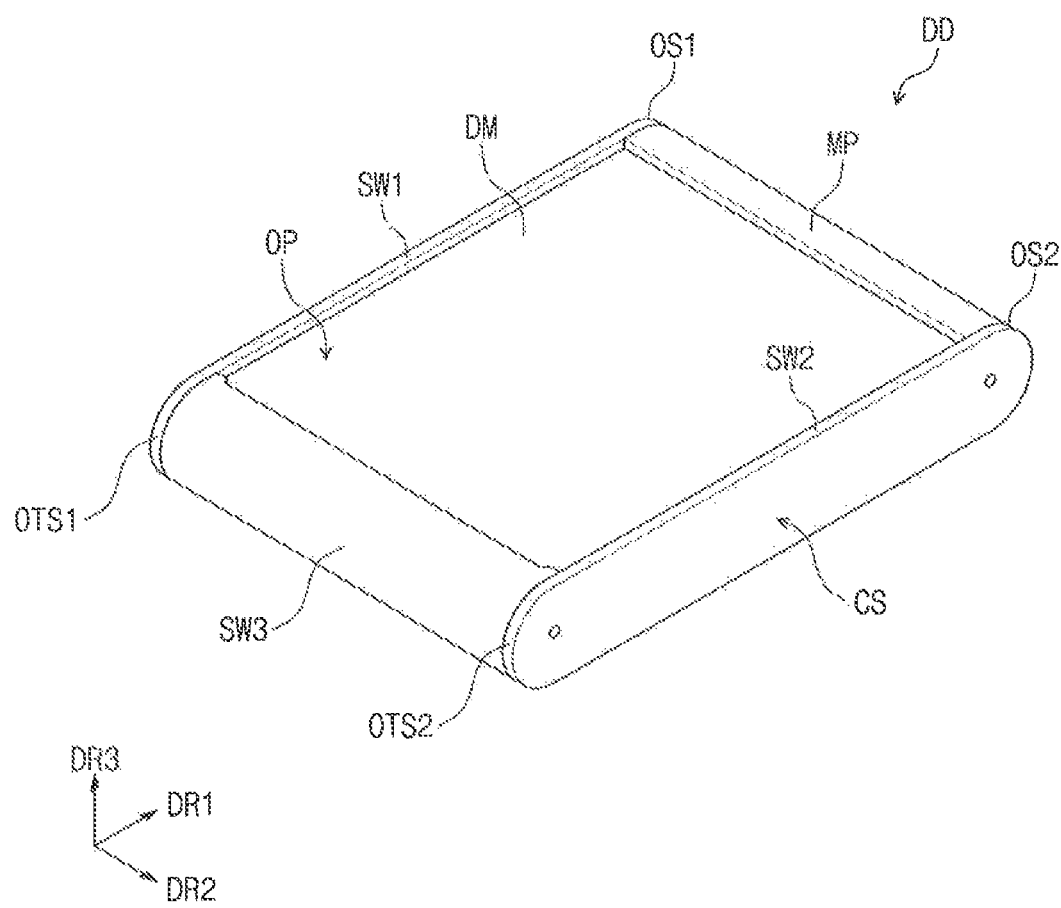
FIG. 1 is a perspective view showing a display device according to an exemplary embodiment of the present disclosure.

In the present disclosure, it will be understood that when an element or layer is referred to as being "on", "connected to" or "coupled to" another element or layer, it may be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Therefore, a first element, component, region, layer or section discussed below could be described as a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be explained in detail with reference to the accompanying drawings.

Figure 2:
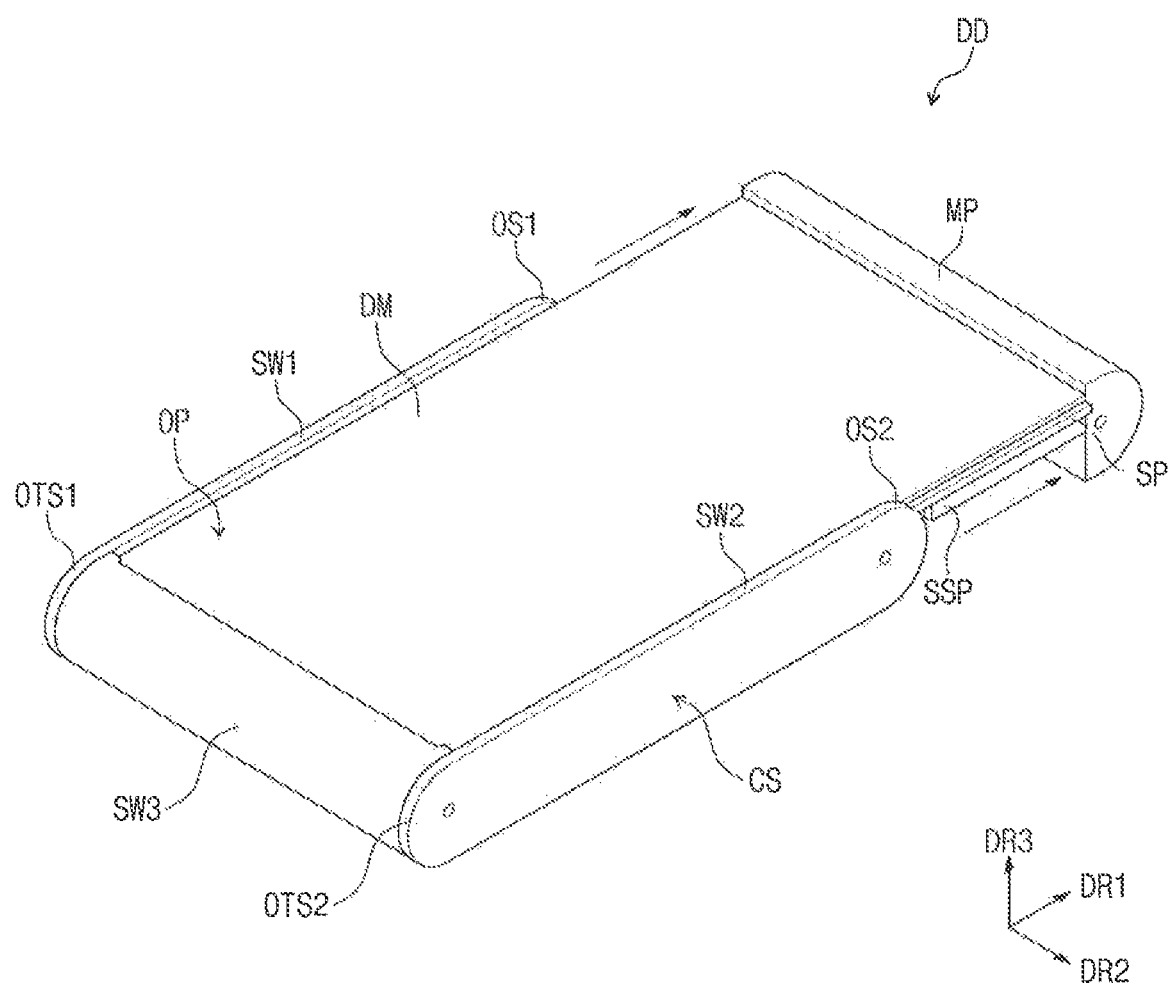
FIG. 2 is a perspective view illustrating an expansion mode of the display device shown in FIG. 1 according to an exemplary embodiment of the present disclosure.

FIG. 1 is a perspective view showing a display device DD according to an exemplary embodiment of the present disclosure. FIG. 2 is a perspective view illustrating an expansion mode of the display device DD shown in FIG. 1 according to an exemplary embodiment of the present disclosure.

Referring to FIG. 1, the display device DD according to the exemplary embodiment of the present disclosure may include a display module DM and a case CS that accommodates (e.g., houses) the display module DM. The display module DM may be exposed to an outside through an opening OP defined through an upper portion of the case CS. For example, as shown in FIG. 1, the upper portion of the case may be a top portion of the case oriented in the third direction DR3 which is parallel to a thickness direction of the case CS.

The case CS may include a first sidewall portion SW1, a second sidewall portion SW2, a third sidewall portion SW3, and a moving portion MP. The first sidewall portion SW1 and the second sidewall portion SW2 may extend in a first direction DR1 and may be arranged in a second direction DR2 that crosses the first direction. The first sidewall portion SW1 and the second sidewall portion SW2 may face each other in the second direction DR2.

The third direction DR3 is a direction substantially perpendicular to a plane surface defined by the first and second directions DR1 and DR2. In the following descriptions, the expression "when viewed in a plan view" may indicate a state viewed in the third direction DR3.

The first and second sidewall portions SW1 and SW2 may have a plane surface generally defined by the first direction DR1 and the third direction DR3. The first and second sidewall portions SW1 and SW2 may extend further in the first direction DR1 than the third direction DR3.

A first side OS1 (e.g., a lateral edge in the first direction DR1) of the first sidewall portion SW1 and the opposing second side OTS1 of the first sidewall portion SW1 may have a convex curved shape toward the outside. The first side OS1 of the first sidewall portion SW1 and the second side OTS1 of the first sidewall portion SW1 may form the two sides of the first sidewall portion SW1, which are opposite to each other in the first direction DR1.

A first side OS2 (e.g., a lateral edge in the first direction DR1) of the second sidewall portion SW2 and the opposing second side OTS2 of the second sidewall portion SW2 may have a convex curved shape toward the outside. The first side OS2 of the second sidewall portion SW2 and the second side OTS2 of the second sidewall portion SW2 may form the two sides of the second sidewall portion SW2, which are opposite to each other in the first direction DR1.

The moving portion MP may extend in the second direction DR2. The moving portion MP may be disposed between the first sidewall portion SW1 (e.g., the first side OS1 of the first sidewall portion) and the second sidewall portion SW2 (e.g., the first side OS2 of the second sidewall portion). In an exemplary embodiment, the moving portion MP may have a convex curved lateral edge surface in the first direction DR1 which corresponds to the convex surfaces of the first side OS1 of the first sidewall portion SW1 and the first side OS2 of the second sidewall portion SW2.

The third sidewall portion SW3 may extend in the second direction DR2. The third sidewall portion SW3 may be disposed between the second side OTS1 of the first sidewall portion SW1 and the second side OTS2 of the second sidewall portion SW2. The third sidewall portion SW3 may have a convex curved surface which corresponds to the convex surfaces of the second side OTS1 of the first sidewall portion SW1 and the second side OTS2 of the second sidewall portion SW2.

The display module DM may be accommodated in a space defined by the first sidewall portion SW1, the second sidewall portion SW2, the third sidewall portion SW3, and the moving portion MP. A portion of the display module DM may be exposed to the outside through the opening OP defined between the first sidewall portion SW1, the second sidewall portion SW2, the third sidewall portion SW3, and the moving portion MP. A first side of the display module DM may be connected to the moving portion MP.

Referring to FIG. 2, an area of the exposed surface of the display module DM may be adjusted by the moving portion MP. For example, in an exemplary embodiment, the display module DM may be a flexible display module and may be supported by a supporter SP disposed under the display module DM. However, exemplary embodiments of the present disclosure are not limited thereto. In an exemplary embodiment, a sub-supporter SSP may be disposed under (e.g., in the third direction DR3) the supporter SP. Configurations of the supporter SP and the sub-supporter SSP will be described later.

A user may move the moving portion MP in the first direction DR1 (e.g., in a direction away from the third sidewall portion SW3) to allow the moving portion MP to be spaced apart (e.g., in the first direction DR1) from the first sidewall portion OS1 (e.g., the first side OS1 of the first sidewall portion) and the second sidewall portion OS2 (e.g., the first side OS2 of the second sidewall portion). An amount of movement of the moving portion MP may be selectively adjusted by the user.

The first side of the display module DM moves in the first direction DR1 due to the movement of the moving portion MP. Therefore, the exposed surface of the display module DM may be expanded. The screen size that the user may view the image through increases as the exposed surface of the display module DM is expanded.

As shown in FIG. 1, the exposed surface of the display module DM may be set to a minimum level in a state in which the moving portion MP is disposed between the first sidewall portion SW1 (e.g., the first side OS1 of the first sidewall portion) and the second sidewall portion SW2 (e.g., the first side OS2 of the second sidewall portion), respectively. This state of the display device DD may be defined as a basic mode or a non-expanded mode. As shown in FIG. 2, a state in which the moving portion MP moves in the first direction DR1 and the exposed surface of the display module DM is expanded may be defined as an expansion mode.

Figure 3:
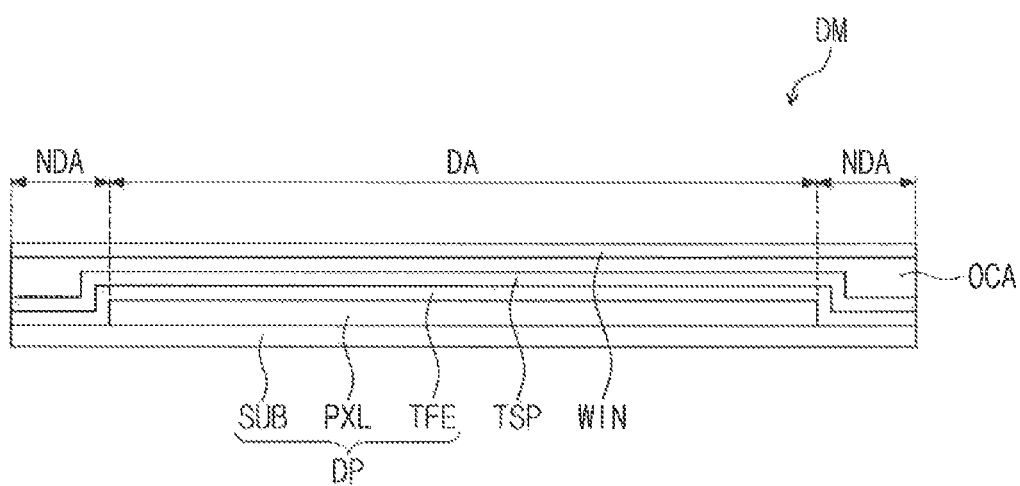
FIG. 3 is a cross-sectional of the display module shown in FIG. 1 according to an exemplary embodiment of the present disclosure.

FIG. 3 is a cross-sectional view schematically showing a cross-section of the display module DM shown in FIG. 1 according to an exemplary embodiment of the present disclosure.

Referring to FIG. 3, the display module DM may include a display panel DP, a touch sensing part TSP disposed on the display panel DP, a window WIN disposed on the touch sensing part TSP, and an adhesive OCA disposed between the touch sensing part TSP and the window WIN. For example, in the exemplary embodiment shown in FIG. 3, the touch sensing part TSP may be disposed directly on the display panel DP and the adhesive OCA may be disposed directly between the touch sensing part TSP and the window WIN.

In an exemplary embodiment, the display panel DP may be an organic light emitting display panel. However, exemplary embodiments of the present disclosure are not limited thereto. For example, various display panels displaying the image, such as a liquid crystal display panel, an electrowetting display panel, and an electrophoretic display panel, may be used as the display panel DP. The display panel DP may be a flexible display panel.

The display panel DP may include a substrate SUB, a pixel layer PXL disposed on the substrate SUB, and a thin film encapsulation layer TFE disposed on the substrate SUB to cover the pixel layer PXL. The substrate SUB may be a transparent substrate, e.g., a flexible plastic substrate. As an example, the substrate SUB may include polyimide (PI).

The substrate SUB may include a display area DA and a non-display area NDA around the display area DA. The pixel layer PXL may be disposed in the display area DA. The pixel layer PXL may include a plurality of pixels, and each of the pixels PXL may include a light emitting device.

In an exemplary embodiment, the thin film encapsulation layer TFE may include at least two inorganic layers and an organic layer disposed between the inorganic layers. The inorganic layers may include an inorganic material that protects the pixel layer PXL from moisture and oxygen. The organic layer may include an organic material that protects the pixel layer PXL from a foreign substance such as dust particles.

The touch sensing part TSP may be disposed on the thin film encapsulation layer TFE. The touch sensing part TSP may sense an external input (e.g., a user's finger or a touch pen) and may convert the sensed input to a predetermined input signal. The touch sensing part TSP may include a plurality of sensing electrodes to sense the external input. In an exemplary embodiment, the sensing electrodes may sense the external input by a capacitive method.

In an exemplary embodiment, the touch sensing part TSP may be directly fabricated on the thin film encapsulation layer TFE when manufacturing the display module DM. However, in another exemplary embodiment, the touch sensing part TSP may be manufactured as a touch panel separate from the display panel DP and may be subsequently attached to the display panel DP by an adhesive.

The window WIN may protect the display panel DP and the touch sensing part TSP from external scratches and impacts. The window WIN may be attached to the touch sensing part TSP by the adhesive OCA. The adhesive OCA may include an optical clear adhesive. The image generated by the display panel DP may pass through the window WIN for viewing by the user.

Figure 4:
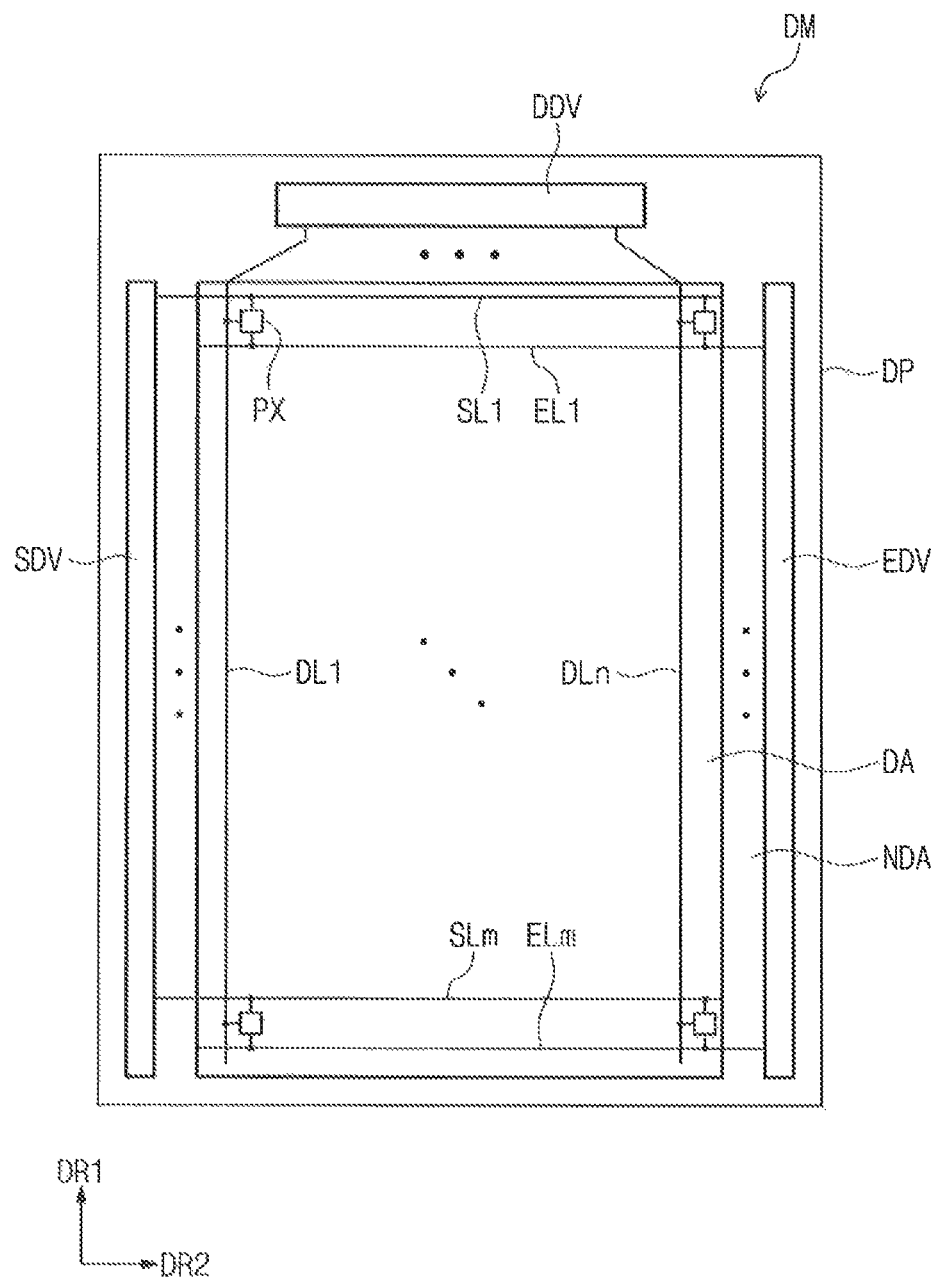
FIG. 4 is a plan view showing the display module shown in FIG. 3 according to an exemplary embodiment of the present disclosure.

FIG. 4 is a plan view showing the display module DM shown in FIG. 3 according to an exemplary embodiment of the present disclosure.

Referring to FIG. 4, the display module DM may include the display panel DP, a scan driver SDV, a data driver DDV, and a light emitting driver EDV. FIG. 4 shows a planar configuration of the display panel DP as an example, and a planar configuration of the touch sensing part TSP is omitted for convenience of description.

In an exemplary embodiment, the display panel DP may have a rectangular shape defined by relatively longer sides extending in the first direction DR1 and arranged in the second direction DR2 and relatively shorter sides extending in the second direction DR2 and arranged in the first direction DR1. The display panel DP may include a plane surface defined by the first and second directions DR1 and DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of light emitting lines EL1 to ELm. Each of "m" and "n" is a natural number. The pixels PX may be arranged in the display area DA and may be connected to the scan lines SL1 to SLm, the data lines DL1 to DLn, and the light emitting lines EL1 to ELm.

The scan driver SDV, the data driver DDV, and the light emitting driver EDV may be arranged in the non-display area NDA. The scan driver SDV may be disposed in the non-display area NDA adjacent to one side of the display panel DP, which is defined as a first long side of the relatively longer sides of the display panel DP.

The light emitting driver EDV may be disposed in the non-display area NDA adjacent to a second long side of the relatively longer sides of the display panel DP, which is opposite to the first long side of the relatively longer sides of the display panel DP. The data driver DDV may be manufactured in an integrated circuit chip form and may be disposed in the non-display area NDA adjacent to a first short side of the relatively shorter sides of the display panel DP.

The scan lines SL1 to SLm may extend in the second direction DR2 and may be arranged in the first direction DR1. Each of the scan lines SL1 to SLm may be connected to the scan driver SDV. The data lines DL1 to DLn may extend in the first direction DR1 and may be arranged in the second direction DR2. Each of the data lines DL1 to DLn may be connected to the data driver DDV. The light emitting lines EL1 to ELm may extend in the second direction DR2 and may be arranged in the first direction DR1. Each of the light emitting lines EL1 to ELM may be connected to the light emitting driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The light emitting driver EDV may generate a plurality of light emitting signals, and the light emitting signals may be applied to the pixels PX through the light emitting lines EL1 to ELm.

The display module DM may further include a timing controller to control an operation of the scan driver SDV, the data driver DDV, and the light emitting driver EDV. The timing controller may generate a scan control signal, a data control signal, and a light emitting control signal in response to control signals applied thereto from the outside. The timing controller may receive image signals from the outside, may convert a data format of the image signals to a data format appropriate to an interface between the data driver DDV and the timing controller, and may provide the converted image signals to the data driver DDV.

The scan driver SDV may generate the scan signals in response to the scan control signal, and the light emitting driver EDV may generate the light emitting signals in response to the light emitting control signal. The data driver DDV may receive the image signals whose data format is converted and may generate the data voltages corresponding to the image signals in response to the data control signal.

The pixels PX may receive the data voltages in response to the scan signals. The pixels PX may emit light having brightness corresponding to the data voltages in response to the light emitting signals to display the image. A light emitting time of the pixels PX may be controlled by the light emitting signals.

Figure 5:
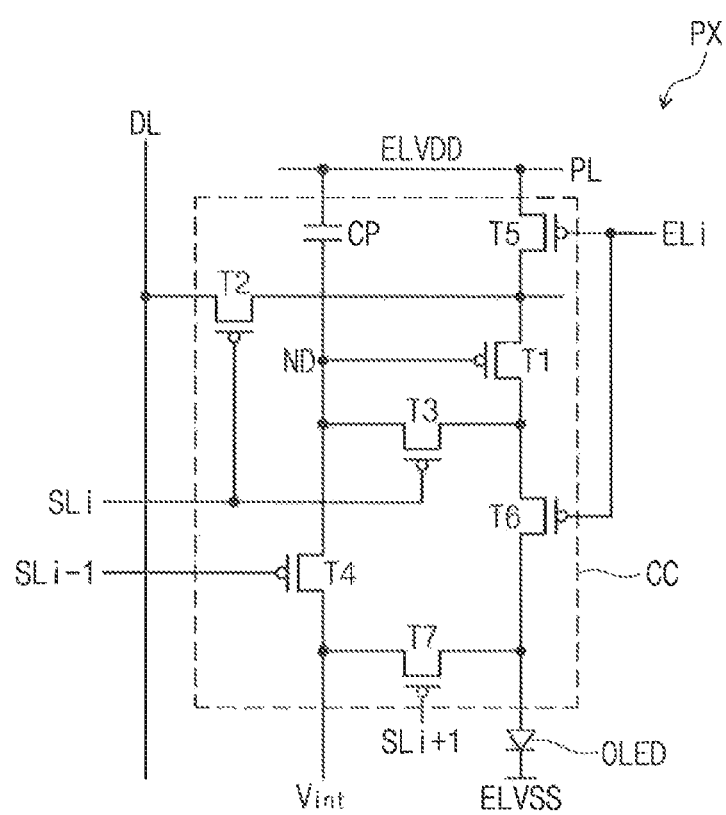
FIG. 5 is an equivalent circuit diagram showing a pixel shown in FIG. 4 according to an exemplary embodiment of the present disclosure.

FIG. 5 is an equivalent circuit diagram showing the pixel PX shown in FIG. 4 according to an exemplary embodiment of the present disclosure.

Referring to FIG. 5, the pixel PX may include an organic light emitting device OLED and a pixel circuit CC. The pixel circuit CC may include a plurality of transistors T1 to T7 and a capacitor CP. The pixel circuit CC may control an amount of current flowing through the organic light emitting device OLED in response to the data voltage.

The organic light emitting device OLED may emit a light at a predetermined luminance in response to the amount of current provided from the pixel circuit CC. To this end, a level of a first voltage ELVDD may be set higher than a level of a second voltage ELVSS.

Each of the transistors T1 to T7 may include an input electrode (or source electrode), an output electrode (or drain electrode), and a control electrode (or gate electrode). In the following descriptions, for the convenience of explanation, one electrode of the input electrode and the output electrode may be referred to as a "first electrode", and the other electrode of the input electrode and the output electrode may be referred to as a "second electrode".

A first electrode of a first transistor T1 may be connected to the first voltage ELVDD via a fifth transistor T5. A second electrode of the first transistor T1 may be connected to an anode electrode of the organic light emitting device OLED via a sixth transistor T6. The first transistor T1 may be referred to as a "driving transistor" in the present disclosure. The first transistor T1 may control the amount of current flowing through the organic light emitting device OLED in response to a voltage applied to a control electrode of the first transistor T1.

A second transistor T2 may be connected between the data line DL and the first electrode of the first transistor T1. A control electrode of the second transistor T2 may be connected to an i-th scan line SLi. The second transistor T2 may be turned on when an i-th scan signal is applied to the i-th scan line SLi and may electrically connect the data line DL to the first electrode of the first transistor T1.

A third transistor T3 may be connected between the second electrode of the first transistor T1 and the control electrode of the first transistor T1. A control electrode of the third transistor T3 may be connected to the i-th scan line SLi. The third transistor T3 may be turned on when the i-th scan signal is applied to the i-th scan line SLi and may electrically connect the second electrode of the first transistor T1 to the control electrode of the first transistor T1. When the third transistor T3 is turned on, the first transistor T1 may be connected in a diode configuration.

A fourth transistor T4 may be connected between a node ND and an initialization power generator. A control electrode of the fourth transistor T4 may be connected to an (i−1)th scan SLi−1. The fourth transistor T4 may be turned on when an (i−1)th scan signal is applied to the (i−1)th scan line SLi−1 and may provide an initialization voltage Vint to the node ND.

The fifth transistor T5 may be connected between a power line PL and the first electrode of the first transistor T1. A control electrode of the fifth transistor T5 may be connected to an i-th light emitting line ELi.

The sixth transistor T6 may be connected between the second electrode of the first transistor T1 and the anode electrode of the organic light emitting device OLED. A control electrode of the sixth transistor T6 may be connected to the i-th light emitting line ELi.

A seventh transistor T7 may be connected between the initialization power generator and the anode electrode of the organic light emitting device OLED. A control electrode of the seventh transistor T7 may be connected to an (i+1)th scan line SLi+1. The seventh transistor T7 may be turned on when an (i+1)th scan signal is applied to the (i+1)th scan line SLi+1 and may provide the initialization voltage Vint to the anode electrode of the organic light emitting device OLED.

The seventh transistor T7 may improve a black expression ability of the pixel PX. For example, when the seventh transistor T7 is turned on, a parasitic capacitance of the organic light emitting device OLED is discharged. Then, when implementing a black luminance, the organic light emitting device OLED does not emit the light due to a leakage current from the first transistor T1. Therefore, the black expression ability may be improved.

Additionally, in FIG. 5, the control electrode of the seventh transistor T7 is connected to the (i+1)th scan line SLi+1. However, the present disclosure should not be limited thereto or thereby. According to another exemplary embodiment of the present disclosure, the control electrode of the seventh transistor T7 may be connected to the i-th scan line SLi or the (i−1)th scan line SLi−1.

The exemplary embodiment of FIG. 5 shows a PMOS as a reference of the pixel PX. However, the pixel PX is not be limited to the PMOS. According to another exemplary embodiment of the present disclosure, the pixel PX may be implemented by an NMOS. According to another exemplary embodiment of the present disclosure, the pixel PX may be implemented by a combination of the NMOS and the PMOS.

The capacitor CP may be disposed between the power line PL and the node ND. The capacitor CP may be charged with a voltage corresponding to the data voltage. When the fifth and sixth transistors T5 and T6 are turned on due to the voltage charged in the capacitor CP, the amount of the current flowing through the first transistor T1 may be determined.

In the present disclosure, the structure of the pixel PX should not be limited to the structure shown in FIG. 5. According to another embodiment of the present disclosure, the pixel PX may be implemented in various ways to allow the organic light emitting device OLED to emit the light. Therefore, exemplary embodiments of the present disclosure may have different numbers of transistors and different arrangements than those shown in the exemplary embodiment of FIG. 5.

Figure 6:
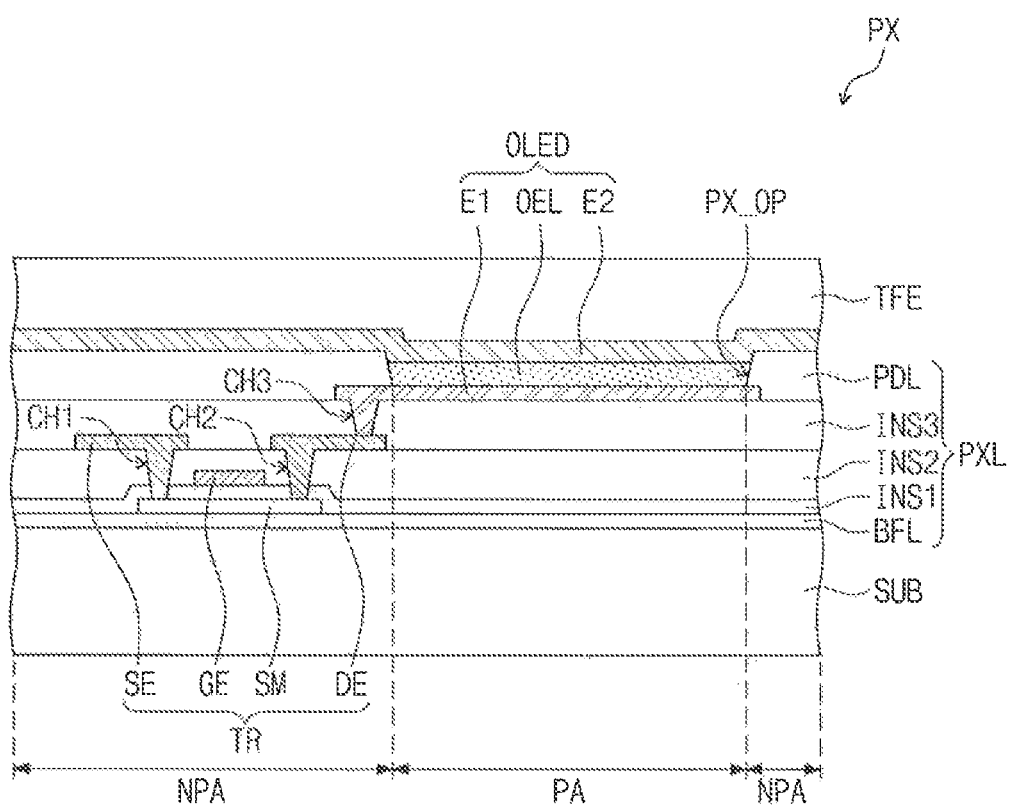
FIG. 6 is a cross-sectional view showing a portion of a light emitting device according to an exemplary embodiment of the present disclosure.

FIG. 6 is a cross-sectional view showing a portion of a light emitting device.

Referring to FIG. 6, the pixel PX may include the organic light emitting device OLED and the transistor TR connected to the organic light emitting device OLED. The organic light emitting device OLED may include a first electrode E1, a second electrode E2, and an organic light emitting layer OEL disposed between the first electrode E1 and the second electrode E2. In an exemplary embodiment, the first electrode E1 may be an anode and the second electrode E2 may be a cathode.

The pixel PX may be divided into a pixel area PA and a non-pixel area NPA around the pixel area PA. The organic light emitting device OLED may be disposed in the pixel area PA and the transistor TR may be disposed in the non-pixel area NPA.

The transistor TR and the organic light emitting device OLED may be disposed on the substrate SUB. A buffer layer BFL may be disposed on the substrate SUB and may include an inorganic material. For example, as shown in the exemplary embodiment of FIG. 6, the buffer layer BFL may be disposed directly on the substrate SUB between the transistor TR and the substrate. A semiconductor layer SM of the transistor TR may be disposed on the buffer layer BFL. For example, as shown in the exemplary embodiment of FIG. 6, the semiconductor layer SM may be disposed directly on the buffer layer BFL. The semiconductor layer SM may include an inorganic semiconductor, such as amorphous silicon or polycrystalline silicon, or an organic semiconductor. In addition, the semiconductor layer SM may include an oxide semiconductor. However, exemplary embodiments of the present disclosure are not limited thereto.

The semiconductor layer SM may also include a source area, a drain area, and a channel area defined between the source area and the drain area.

A first insulating layer INS1 may be disposed on the buffer layer BFL. For example, as shown in the exemplary embodiment of FIG. 6, the first insulating layer INS1 may be disposed directly on the buffer layer BFL to cover the semiconductor layer SM. The first insulating layer INS1 may include an inorganic material. A gate electrode GE of the transistor TR may be disposed on the first insulating layer INS1 to overlap with the semiconductor layer SM. For example, the gate electrode GE of the transistor TR may be disposed directly on the first insulating layer INS1. The gate electrode GE may be disposed to overlap with the channel area of the semiconductor layer SM.

A second insulating layer INS2 may be disposed on the first insulating layer INS1 to cover the gate electrode GE. For example, the second insulating layer INS2 may be disposed directly on the first insulating layer INS1. The second insulating layer INS2 may be defined as an "interlayer insulating layer". In an exemplary embodiment, the second insulating layer INS2 may include an organic material and/or an inorganic material.

A source electrode SE and a drain electrode DE of the transistor TR may be disposed on the second insulating layer INS2 to be spaced apart from each other. For example, the source electrode SE and a drain electrode DE of the transistor TR may be disposed directly on the second insulating layer INS2. The source electrode SE may be connected to the source area of the semiconductor layer SM through a first contact hole CH1 defined through the first insulating layer INS1 and the second insulating layer INS2. The drain electrode DE may be connected to the drain area of the semiconductor layer SM through a second contact hole CH2 defined through the first insulating layer INS1 and the second insulating layer INS2.

A third insulating layer INS3 may be disposed on the second insulating layer INS2. For example, the third insulating layer INS3 may be disposed directly on the second insulating layer INS2 to cover the source electrode SE and the drain electrode DE of the transistor TR. The third insulating layer INS3 may be defined as a "planarization layer" that provides a flat upper surface. In an exemplary embodiment, the third insulating layer INS3 may include an organic material.

The first electrode E1 may be disposed on the third insulating layer INS3. For example, the first electrode E1 may be disposed directly on the third insulating layer INS3. The first electrode E1 may be connected to the drain electrode DE of the transistor TR through a third contact hole CH3 defined through the third insulating layer INS3. The first electrode E1 may be defined as a "pixel electrode". In an exemplary embodiment, the first electrode E1 may include a transparent electrode or a reflective electrode.

A pixel definition layer PDL may be disposed on (e.g., directly on) the first electrode E1 and the third insulating layer INS3 to expose a predetermined portion of the first electrode E1. An opening PX_OP may be defined through the pixel definition layer PDL to expose the predetermined portion of the first electrode E1.

The organic light emitting layer OEL may be disposed on (e.g., directly on) the first electrode E1 in the opening PX_OP. The organic light emitting layer OEL may generate a light. For example, the organic light emitting layer OEL may generate a light having one of red, green, and blue colors. However, exemplary embodiments of the present disclosure are not limited thereto. The organic light emitting layer OEL may generate a white light by a combination of organic materials respectively generating the red, green, and blue colors.

The second electrode E2 may be disposed on (e.g., directly on) the pixel definition layer PDL and the organic light emitting layer OEL. The second electrode E2 may be defined as a "common electrode". The second electrode E2 may include a transparent electrode or a reflective electrode.

In an embodiment where the display panel DP is a front surface light emitting type organic light emitting display panel, the first electrode E1 is a reflective electrode, and the second electrode E2 is a transparent electrode. In an embodiment where the display panel DP is a rear surface light emitting type organic light emitting display panel, the first electrode E1 is a transparent electrode and the second electrode E2 is a reflective electrode.

The thin film encapsulation layer TFE may be disposed on (e.g., directly on) the organic light emitting device OLED to cover the pixel PX. A layer disposed between the substrate SUB and the thin film encapsulation layer TFE may be defined as a "pixel layer PXL".

The first voltage ELVDD shown in FIG. 5 may be applied to the first electrode E1, and the second voltage ELVSS may be applied to the second electrode E2. Holes and electrons injected into the organic light emitting layer OEL are recombined to generate excitons, and the organic light emitting device OLED may emit the light by the excitors that return to a ground state from an excited state. The organic light emitting device OLED may emit red, green, and blue lights in accordance with the current flow, so that the image may be displayed.

Hereinafter, the display device DD will be described in detail with reference to FIGS. 7 to 9.

Figure 7:
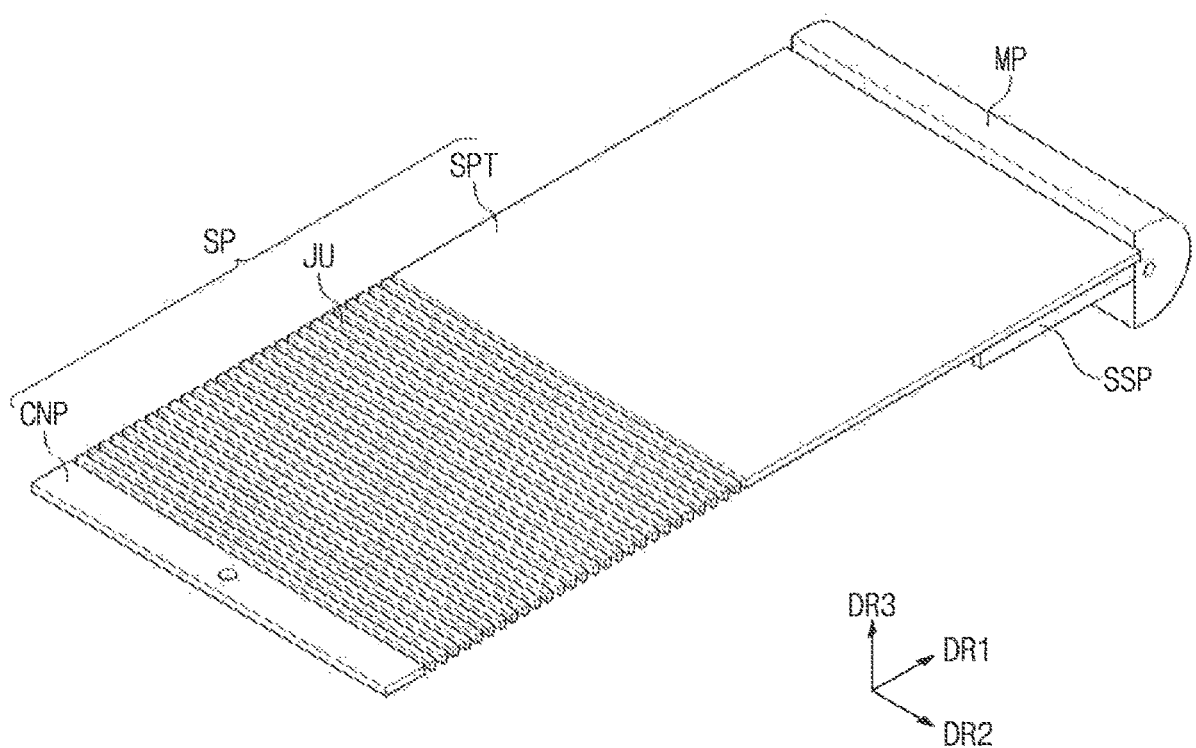
FIG. 7 is a perspective view showing a supporter for supporting the display module shown in FIG. 1 according to an exemplary embodiment of the present disclosure.

FIG. 7 is a perspective view showing a supporter for supporting the display module shown in FIG. 1 according to an exemplary embodiment of the present disclosure. FIG. 8 is a side elevational view showing the display module disposed on the supporter shown in FIG. 7 according to an exemplary embodiment of the present disclosure.

Figure 8:
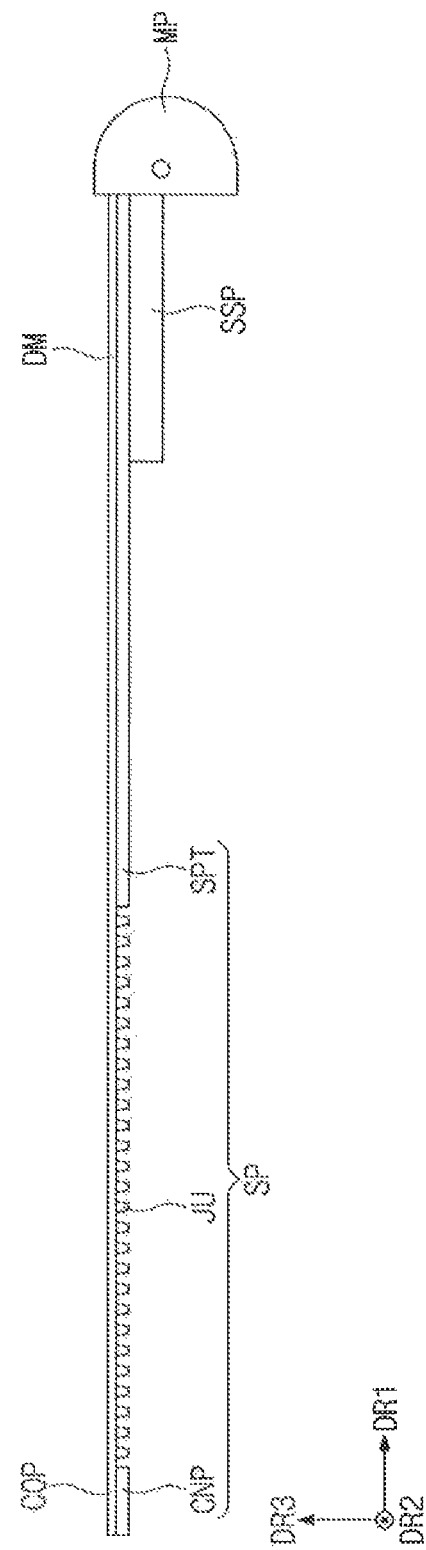
FIG. 8 is a side elevational view showing a display module disposed on the supporter shown in FIG. 7 according to an exemplary embodiment of the present disclosure.

For convenience of explanation, FIG. 8 shows a side surface of the supporter SP and the display module DM when viewed in the second direction DR2.

Referring to FIGS. 7 and 8, the display device DD may include the supporter SP that supports the display module DM. For example, the supporter SP may be disposed under the display module DM in the third direction DR3. The supporter SP may be attached to a lower surface (e.g., in the third direction DR3) of the display module DM, which is opposite to the upper surface of the display module DM.

In an exemplary embodiment, an adhesive may be disposed between the supporter SP and the display module DM, and the supporter SP may be attached to the lower surface of the display module DM by the adhesive. For example, the adhesive may include a pressure sensitive adhesive. However, various other adhesives may be used for the adhesive. In other exemplary embodiments of the present disclosure, an adhesive may not be used and the supporter SP may be attached to the display module DM by other means known in the art.

The supporter SP may include a support plate SPT, a connection portion CNP, and a plurality of joint units JU disposed between the support plate SPT and the connection portion CNP. The support plate SPT may include a plane surface defined by the first and second directions DR1 and DR2. A first side of the support plate SPT (e.g., a lateral edge in the first direction DR1) may be connected to the moving portion MP. The first side of the support plate SPT may overlap with the first side of the display module DM.

Sub-supporters SSP may be disposed under the support plate SPT. In FIG. 7, one sub-supporter SSP is shown due to the angle of the perspective view. However, two or more sub-supporters SSP may be disposed under the support plate SPT. The sub-supporters SSP may be disposed to be respectively adjacent to both sides (e.g., lateral edges in the second direction DR2 and extending in the first direction DR1) of the support plate SPT, which are opposite to each other and arranged in the second direction DR2. An exemplary embodiment that includes two sub-supporters SSP will be shown in FIG. 14.

The sub-supporters SSP may extend in the first direction DR1 and may be connected to the moving portion MP. A length in the first direction DR1 of the sub-supporters SSP may be smaller than a length of the support plate SPT. The support plate SPT may be disposed on the sub-supporters SSP and may be connected to the sub-supporters SSP.

The first side of the display module DM and the opposing second side of the display module DM may form both sides of the display module DM, which are opposite to each other in the first direction DR1. A predetermined portion of the display module DM adjacent to the second side of the display module DM may be defined as a coupling portion COP.

The connection portion CNP of the supporter SP may extend in the second direction DR2. The connection portion CNP may be positioned on a second side (e.g., lateral edge in the first direction) of the supporter SP which is opposite a first side of the supporter SP which includes the support plate SPT connected to the moving portion MP. The connection portion CNP may be a portion of the supporter SP that overlaps (e.g., in the third direction DR3) with the coupling portion COP of the display module DM.

The joint units JU may extend in the second direction DR2 and may be arranged in the first direction DR1. When viewed in the second direction DR2, the joint units JU may have an inverted trapezoidal shape. The joint units JU may be spaced apart from each other in the first direction DR1.

Figure 9:
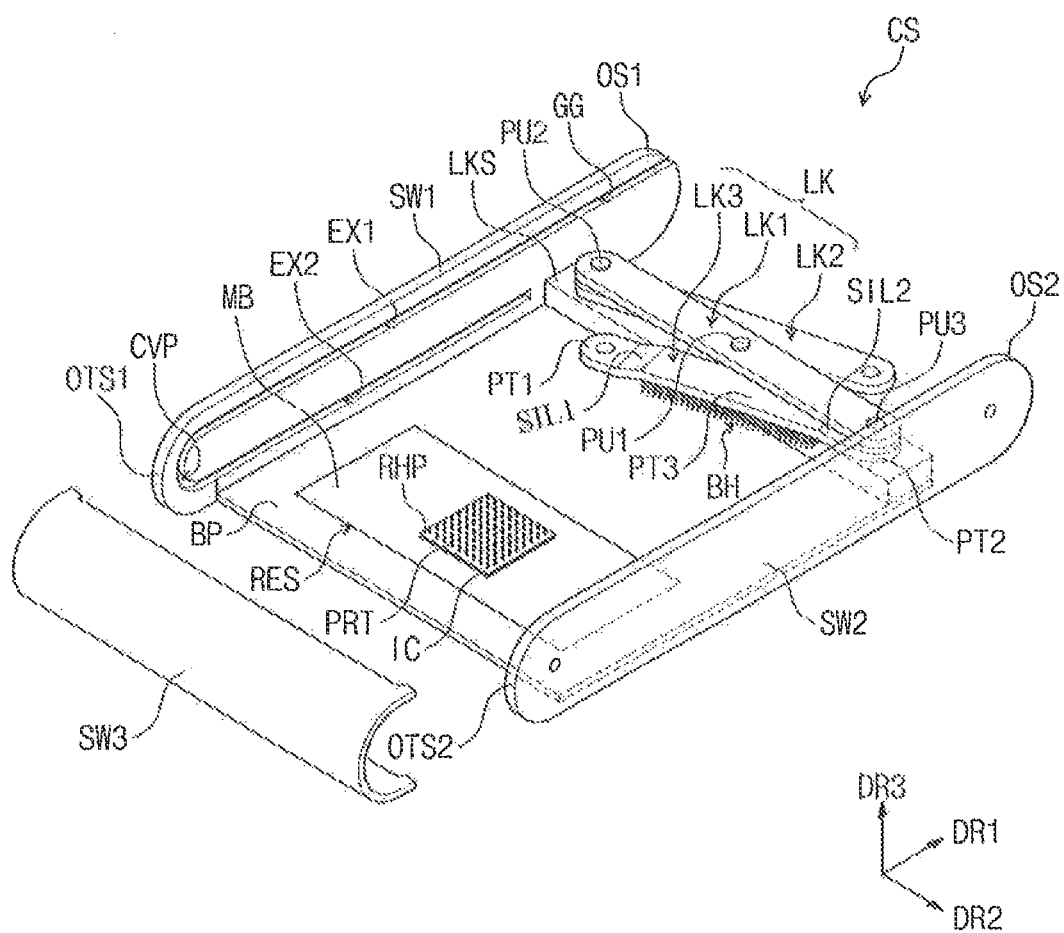
FIG. 9 is an exploded perspective view showing the case shown in FIG. 1 according to an exemplary embodiment of the present disclosure.
Figure 10:
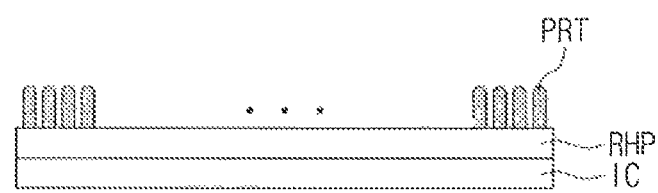
FIG. 10 is an enlarged side elevational view showing a driving integrated circuit, a heat discharge plate, and branch portions shown in FIG. 9 according to exemplary embodiments of the present disclosure.
Figure 11:
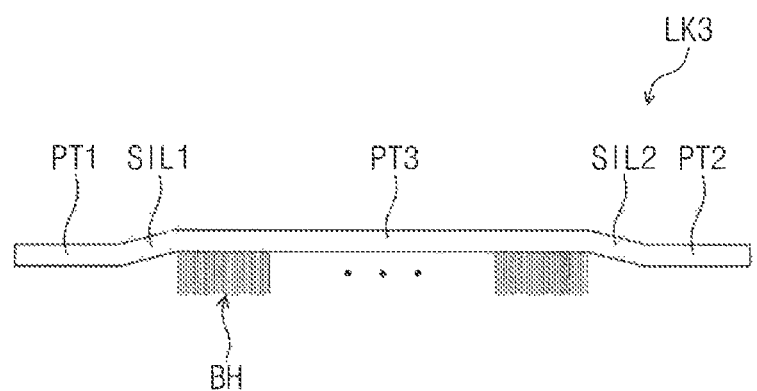
FIG. 11 is an enlarged side elevational view showing a third link portion shown in FIG. 9 according to an exemplary embodiment of the present disclosure.

FIG. 9 is an exploded perspective view showing the case CS shown in FIG. 1. FIG. 10 is an enlarged side elevational view showing a driving integrated circuit, a heat discharge plate, and branch portions shown in FIG. 9. FIG. 11 is an enlarged view showing a third link portion shown in FIG. 9.

For the convenience of explanation, the moving portion MP is omitted in FIG. 9, and FIGS. 10 and 11 show side surfaces of the driving integrated circuit IC, the heat discharge plate RHP, and the third link portion LK3.

Referring to FIG. 9, a guide groove GG may be defined in each of inner side surfaces of the first sidewall portion SW1 and the second sidewall portion SW2, which face each other. In FIG. 9, the guide groove GG defined in the inner side surface of the second sidewall portion SW2 is not shown due to the angle of the perspective view. However, the guide groove GG may also be defined in the inner side surface of the second sidewall portion SW2 and may be configured similarly to the guide groove defined in the inner side surface of the first sidewall portion SW1. The guide groove GG may be defined by being recessed into each of the first sidewall portion SW1 and the second sidewall portion SW2 from each of the inner side surfaces of the first sidewall portion SW1 and the second sidewall portion SW2. The recess may extend in the second direction DR2 from the inner side surfaces of the first sidewall portion SW1 and the second sidewall portion SW2.

The guide groove GG may include a first extension portion EX1, a second extension portion EX2, and a curved portion CVP. The first extension portion EX1 may extend in the first direction DR1. The second extension portion EX2 may extend in the first direction DR1 and may be disposed under (e.g., in the third direction DR3) the first extension portion EX1. A length in the first direction DR1 of the second extension portion EX2 may be smaller than length in the first direction DR1 of the first extension portion EX1.

The curved portion CVP may extend from a second end of the first extension portion EX1 adjacent the second side OTS1 of the first sidewall portion SW1 to a second end of the second extension portion EX2 adjacent the second side of the first sidewall portion. The curved portion CVP may have a curved shape. For example, the curved portion CVP defined in the first sidewall portion SW1 may have a convex curved shape toward the second side OTS1 of the first sidewall portion.

The curved portion CVP of the second sidewall portion SW2 may have a similar configuration. For example, the curved portion CVP may extend from a second end of the first extension portion adjacent the second side OTS2 of the second sidewall SW2 to a second end of the second extension portion EX2 adjacent the second side of the second sidewall. The curved portion CVP may have a curved shape. For example, the curved portion CVP defined in the second sidewall portion SW2 may have a convex curved shape toward the second side OTS2 of the second sidewall portion.

The case CS may further include a bottom portion BP, a link support portion LKS, and a link portion LK. The bottom portion BP, the link support portion LKS, and the link portion LK may be disposed between the first sidewall portion SW1 and the second sidewall portion SW2.

The bottom portion BP may be disposed to be adjacent to a lower end (e.g., in the third direction DR3) of the first sidewall portion SW1 and a lower end (e.g., in the third direction DR3) of the second sidewall portion SW2. The bottom portion BP may be connected to the first sidewall portion SW1 and the second sidewall portion SW2. The bottom portion BP may have a plane surface defined by the first and second directions DR1 and DR2. The bottom portion BP may be disposed under (e.g., in the third direction DR3) the second extension portion EX2.

A main board MB of the display device DD and the driving integrated circuit IC mounted on the main board MB may be disposed on the bottom portion BP. The driving integrated circuit IC may be implemented by a system-on-chip (SoC) or an application processor (AP) to control an overall operation of the display device DD. A recess portion RES may be defined in the bottom portion BP and may extend in the third direction DR3. The main board MB may be inserted into the recess portion RES.

Referring to FIGS. 9 and 10, the heat discharge plate RHP may be disposed on the driving integrated circuit IC. A plurality of protrusion portions PRT may be disposed on the heat discharge plate RHP. The protrusion portions PRT may extend in an upward direction (e.g., in the third direction DR3).

In an exemplary embodiment, the heat discharge plate RHP may be attached to an upper surface (e.g., in the third direction DR3) of the driving integrated circuit IC by an adhesive, such as a heat-conductive paste. The heat discharge plate RHP and the protrusion portions PRT may include a metal material. For example, the heat discharge plate RHP and the protrusion portions PRT may include copper or aluminum. However, exemplary embodiments of the present disclosure are not limited thereto.

Referring to FIG. 9, the link support portion LKS may be disposed under the link portion LK. The link support portion LKS may extend in the second direction DR2 and may be connected to inner side surfaces of the first sidewall portion SW1 and the second sidewall portion SW2. For example, in an exemplary embodiment, the link support portion LKS may be connected to portions of the inner side surfaces of the first sidewall portion SW1 and the second sidewall portion SW2 that are adjacent to the first end of the second extension portion EX2 and are disposed under the first extension portion EX1. The first end of the second extension portion EXT2 is opposite the second end of the second extension portion adjacent to the second sides OTS1, OTS2 of the second extension portions EX2 of the first sidewall portion SW1 and second sidewall portion SW2, respectively.

The link portion LK may include a first link portion LK1, a second link portion LK2, and a third link portion LK3. The first link portion LK1 may be disposed on the link support portion LKS and may extend in the second direction DR2. The first link portion LK1 may rotate with respect to a center portion of the first link portion LK1. For example, the center portion of the first link portion LK1 may be coupled to a center of the link support portion LKS by a first pin unit PU1 which provides an axis of rotation for the first link portion LK1.

While the axis of rotation is described as being defined in a center portion of the first link portion LK1, exemplary embodiments of the present disclosure are not limited thereto. For example, a first pin unit PU1 or the like may be coupled to various other portions of the first link portion LK1 and the first link portion may rotate with respect to such portions.

The second link portion LK2 may be coupled to a predetermined portion of the first link portion LK1 adjacent to a first side of the first link portion LK1 and may be configured to be rotated. For example, a predetermined portion of the second link portion LK2 adjacent to a first side of the second link portion LK2 may be coupled to the predetermined portion of the first link portion LK1 adjacent to the first side of the first link portion LK1 by a second pin unit PU2 to be rotated which provides an axis of rotation for the second link portion LK2.

The third link portion LK3 may be coupled to a predetermined portion of the first link portion LK1 adjacent to the second side of the first link portion LK1 and may be configured to be rotated with respect to the connection point. The first and second sides of the first link portion LK1 may form both sides of the first link portion LK1, which are opposite to each other in the second direction DR2. A predetermined portion of the third link portion LK3 adjacent to the second side of the third link portion LK3 may be coupled to the predetermined portion of the first link portion LK1 adjacent to the second side of the first link portion LK1 by a third pin unit PU3. The third pin unit PU3 may provide an axis of rotation for the third link portion LK3.

Referring to FIGS. 9 and 11, the third link portion LK3 may include a first portion PT1, a second portion PT2, a third portion PT3, a first inclination portion SIL1, a second inclination portion SIL2, and a plurality of branch portions BH. The third portion PT3 may be disposed between the first portion PT1 and the second portion PT2. A height (e.g., in the third direction DR3) of a lower surface of the third portion PT3 may be higher than a height of a lower surface of each of the first and second portions PT1 and PT2. The second portion PT2 may be coupled to the first link portion LK1 by the third pin unit PU3 to be rotated thereby.

The branch portions BH may be disposed under (e.g., in the third direction DR3) the third portion PT3 and may extend downward. Each of the branch portions BH may have a diameter (e.g., in the first and second directions DR1, DR2) that is smaller than a diameter of each of the protrusion portions PRT. The branch portions BH may include a metal material. For example, the branch portions BH may include copper or aluminum. However, exemplary embodiments of the present disclosure are not limited thereto.

The first inclination portion SIL1 may be disposed between the first portion PT1 and the third portion PT3. The first inclination portion SIL1 may include an inclined surface (e.g., in the third direction DR3) and may extend from the first portion PT1 to the third portion PT3. In an exemplary embodiment, the height of the first inclination portion SIL1 may increase as the first inclination portion extends from the first portion PT1 to the third portion PT3.

The second inclination portion SIL2 may be disposed between the second portion PT2 and the third portion PT3. The second inclination portion SIL2 may include an inclined surface (e.g., in the third direction DR3) and may extend from the second portion PT2 to the third portion PT3. In an exemplary embodiment, the height of the second inclination portion SIL2 may increase as the second inclination portion extends from the second portion PT2 to the third portion PT3. In an exemplary embodiment, the second inclination portion SIL2 may have a symmetrical shape with respect to the first inclination portion SIL1.

Figure 12:
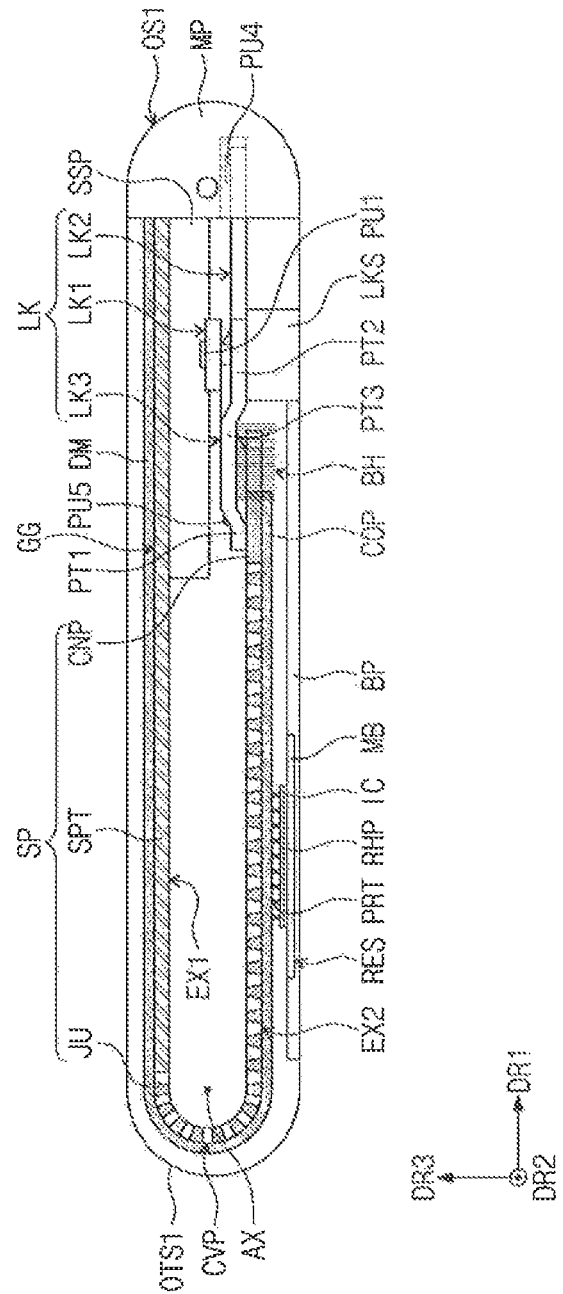
FIG. 12 is a side elevational view showing an inner side surface of a first sidewall portion of the display device shown in FIG. 1 according to an exemplary embodiment of the present disclosure.
Figure 13:
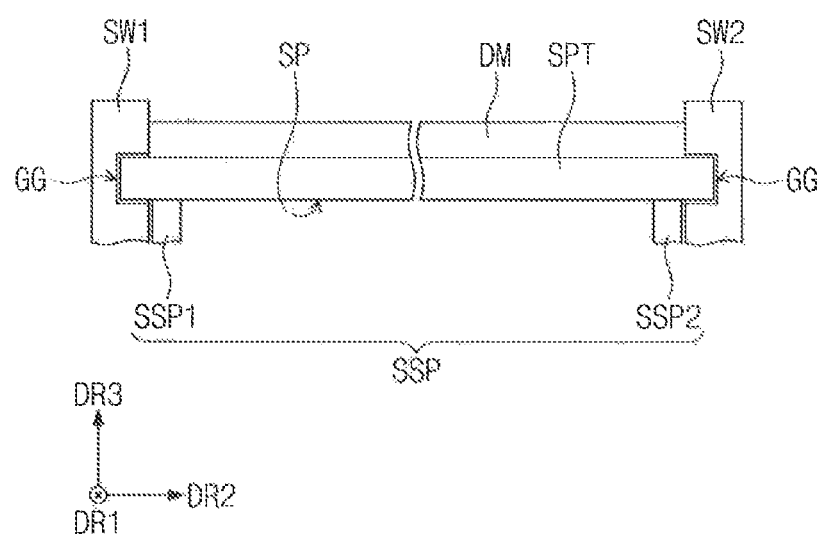
FIG. 13 is a sectional view showing the supporter inserted in a guide groove shown in FIG. 12 according to an exemplary embodiment of the present disclosure.
Figure 14:
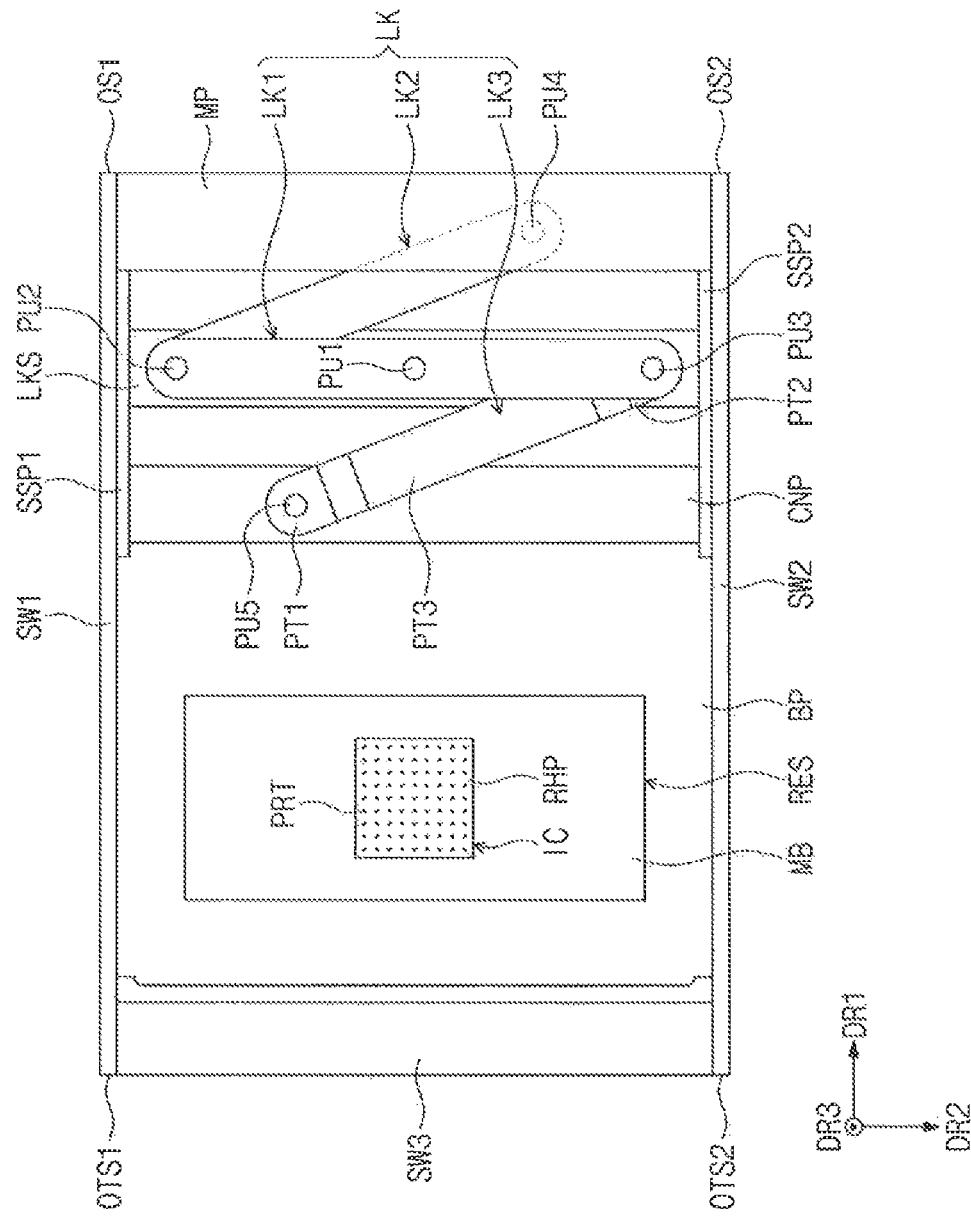
FIG. 14 is a plan view showing the display device shown in FIG. 12 according to an exemplary embodiment of the present disclosure.

FIG. 12 is a side elevational view showing an inner side surface of a first sidewall portion of the display device shown in FIG. 1 according to an exemplary embodiment of the present disclosure. FIG. 13 is a sectional view showing the supporter inserted in the guide groove shown in FIG. 12 according to an exemplary embodiment of the present disclosure. FIG. 14 is a plan view showing the display device shown in FIG. 12 according to an exemplary embodiment of the present disclosure.

Hereinafter, with reference to the configurations described in FIGS. 7 to 9, the configuration of the display device DD shown in FIGS. 12 to 14 will be described. For convenience of explanation, the inner configuration of the display device in FIG. 12 is shown in a direction in which an inner side surface of the first sidewall portion SW1 is viewed. FIG. 13 shows a cross-sectional view of portions of the first and second sidewall portions SW1 and SW2 and a portion of the support plate SPT. In FIG. 14 the display module DM, the support plate SPT, and the joint units JU are omitted to show the inner configuration of the display device DD.

Referring to FIGS. 12 and 14, in the basic mode the support plate SPT of the supporter SP may be disposed on the first extension portion EX1 of the first and second sidewall portions SW1, SW2 of the case CS, and the connection portion CNP of the supporter may be disposed on the second extension portion EX2 of the first and second sidewall portions. The connection portion CNP may be disposed to be adjacent to the link portion LK (e.g., in the first direction DR1). For example, the connection portion CNP may be adjacent to the third link portion LK3. The joint units JU may be disposed on the curved portion CVP and the second extension portion EX2 between the support plate SPT and the connection portion CNP.

Referring to FIG. 13, both sides of the supporter SP, which are opposite to each other in the second direction DR2, may be respectively inserted into the guide grooves GG defined in the first and second sidewall portions SW1 and SW2. For example, both sides of the support plate SPT, which are opposite to each other in the second direction DR2, may be respectively inserted into the guide grooves GG. In FIG. 12, the support plate SPT is shown as a representative example, however, both sides of the joint units and both sides of the connection portion CNP may be inserted into the guide grooves GG. The support plate SP may move along the guide grooves GG when the user moves the moving portion MP in the first direction DR1.

The two sub-supporters SSP may be respectively disposed on the inner side surfaces of the first and second sidewall portions SW1 and SW2. The support plate SPT may be disposed on the sub-supporters SSP. For example, a lower portion of the support plate SPT (e.g., in the third direction DR3) may be disposed on an upper portion of the sub-supporters SSP. Both sides of the support plate SPT, which are opposite to each other in the second direction DR2, may be supported by the sub-supporters SSP. The sub-supporters SSP may include a first sub-supporter SSP1 disposed on the inner side surface of the first sidewall portion SW1 and a second sub-supporter SSP2 disposed on the inner side surface of the second sidewall portion SW2. However, in other exemplary embodiments, a plurality of sub-supporters may be included on each of the first and second sidewall portions SW1, SW2.

Referring to FIGS. 12 and 14, the second link portion LK2 may be coupled to the moving portion MP to be rotated thereby. A predetermined portion of the second link portion LK2 adjacent to the second side of the second link portion LK2 (opposite the first side of the second link portion) may be coupled to the moving portion MP by a fourth pin unit PU4. The fourth pin unit PU4 may provide an axis of rotation for the second link portion LK2. The predetermined portion of the second link portion LK2 adjacent to the second side of the second link portion LK2 may be inserted into the moving portion MP to be coupled to the moving portion MP. A portion of the moving portion MP, into which the fourth pin unit PU4 and the second link portion LK2 are inserted, is indicated by a dotted line.

The link portion LK may be coupled to the connection portion CNP of the supporter SP and the coupling portion COP of the display module DM to be rotated. For example, the third link portion LK3 may be coupled to the connection portion CNP and the coupling portion COP to be rotated when the moving portion MP is moved in the first direction DR1. As described above, the connection portion CNP may be a portion of the supporter SP overlapping (e.g., in the third direction DR3) with the coupling portion COP of the display module DM. The first portion PT1 of the third link portion LK3 may be coupled to the connection portion CNP and the coupling portion COP by a fifth pin unit PU5 to be rotated.

The support plate SPT, the joint units JU, and the connection portion CNP may be disposed on the lower surface (e.g., in the third direction DR3) of the display module DM to support the display module DM. Accordingly, the display module DM may be deformed into a folded state along the curved portion CVP. For example, the display module DM may have a shape that is folded with respect to an axis AX disposed adjacent to the curved portion CVP and extending in the second direction DR2. The first side of the display module DM may be connected to the moving portion MP and the second side of the display module DM may be disposed lower than the first side of the display module DM.

FIGS. 12 and 14 show the display device of FIG. 1 in the basic mode. In the basic mode, a flat portion of the display module DM, which is disposed on the support plate SPT, may be exposed to the outside. Portions of the display module DM, which are disposed on the joint units JU and the connection portion CNP, may not be exposed to the outside.

In the basic mode, the moving portion MP may be disposed between the first sidewall portion SW1 (e.g., the first side OS1 of the first sidewall portion) and the second sidewall portion SW2 (e.g., the first side OS2 of the second sidewall portion), and the first link portion LK1 may be disposed substantially parallel to the second direction DR2. In addition, in the basic mode, the moving portion MP and the connection portion CNP may be disposed adjacent to the link support portion LKS.

Figure 15:
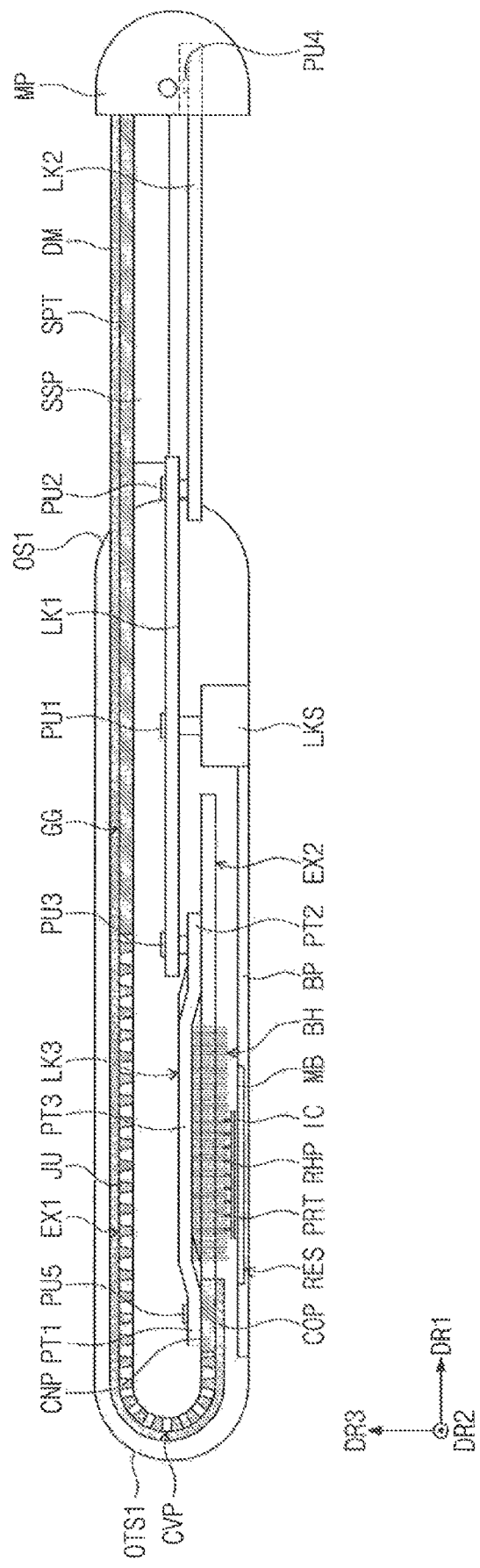
FIG. 15 is a side elevational view showing an expansion mode of the display device shown in FIG. 12 according to an exemplary embodiment of the present disclosure.
Figure 16:
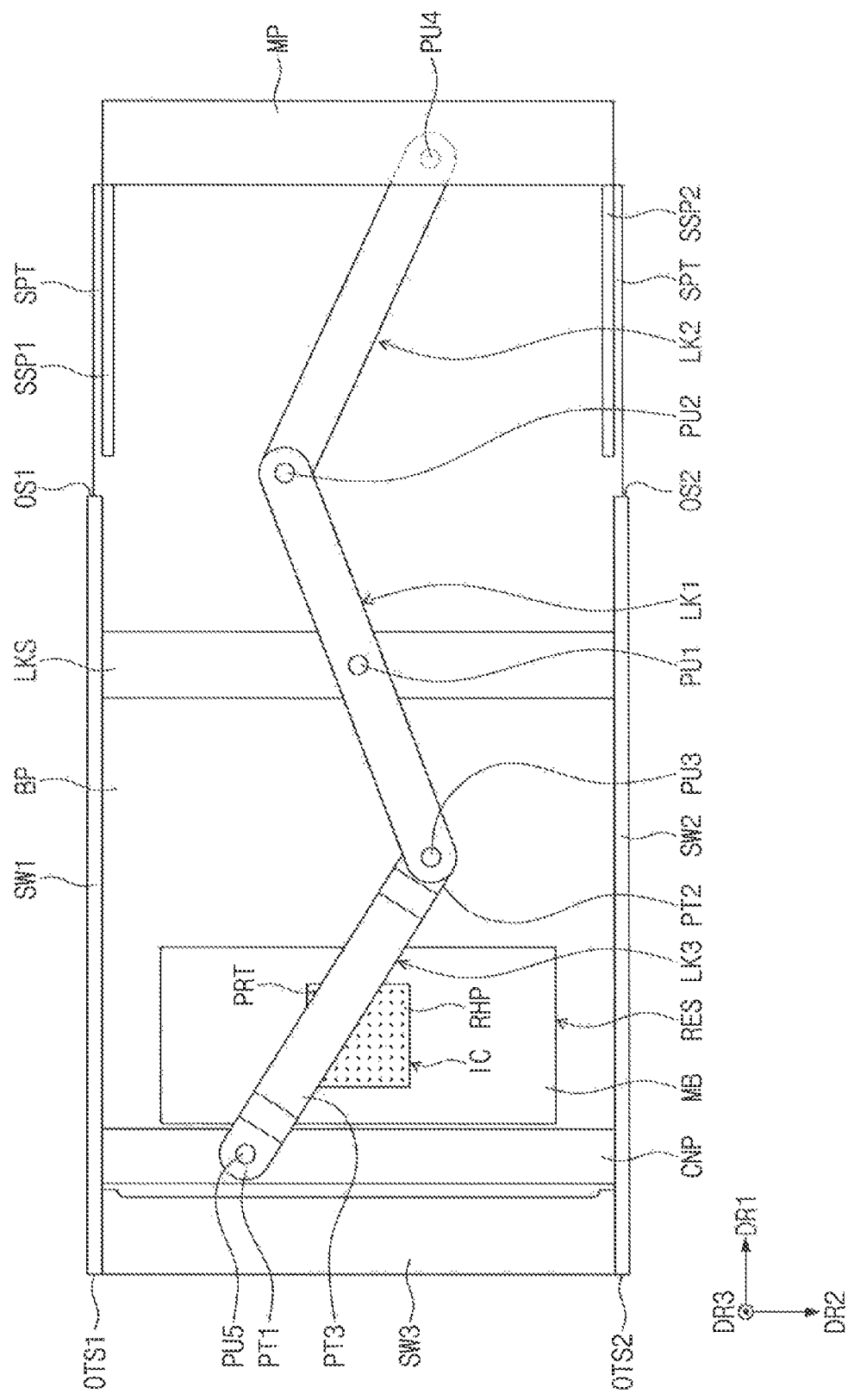
FIG. 16 is a plan view showing the expansion mode of the display device shown in FIG. 15 according to an exemplary embodiment of the present disclosure.

FIG. 15 is a side elevational view showing an expansion mode of the display device shown in FIG. 12. FIG. 16 is a plan view showing the expansion mode of the display device shown in FIG. 15.

FIG. 15 is a view substantially showing an inner configuration of the display device corresponding to FIG. 12 in an expansion mode, and FIG. 16 is a plan view showing a display device corresponding to FIG. 14.

Referring to FIGS. 15 and 16, the moving portion MP may move in the first direction DR1 in the expansion mode, and the link portion LK may expand in the first direction DR1 such that the moving portion MP and the coupling portion COP are distant from each other (e.g., in the first direction DR1) in the expansion mode. For example, the moving portion MP and the coupling portion COP are spaced farther apart in the first direction DR1 when the display device is in the expansion mode as compared to the basic mode. In addition, the link portion LK may expand in the first direction DR1 such that the moving portion MP and the connection portion CNP are distant from each other (e.g., in the first direction DR1).

Due to the movement of the moving portion MP, the first link portion LK1 may rotate in a clockwise direction with respect to the first pin unit PU1. The second link portion LK2 may rotate with respect to the second pin unit PU2 and the fourth pin unit PU4. The third link portion LK3 may rotate with respect to the third pin unit PU3 and the fifth pin unit PU5.

A folding angle formed by the first link portion LK1 and the second link portion LK2 shown in FIG. 16 may be greater than a folding angle formed by the first link portion LK1 and the second link portion LK2 shown in FIG. 14. A folding angle formed by the first link portion LK1 and the third link portion LK3 shown in FIG. 16 may be greater than a folding angle formed by the first link portion LK1 and the third link portion LK3 shown in FIG. 14. For example, in an exemplary embodiment, the folding angle formed by the first link portion LK1 and the third link portion LK3 in the expansion mode may be in a range of 110°-160° and the folding angle in the basic mode may be in a range of 5°-70°. Accordingly, the connection portion CNP and the coupling portion COP may be further away from the link support portion LKS in the expansion mode than in the basic mode.

As the moving portion MP moves in the first direction DR1 (e.g., in a direction away from the third sidewall portion SW3), the support plate SPT may move along the guide groove GG to the outside of the first and second sidewall portions SW1 and SW2, and the exposed surface of the display module DM may be expanded. The support plate SPT may move to the outside along the first extension portion EX1. For the convenience of explanation, FIG. 16 shows both sides of the support plate SPT, which are opposite to each other in the second direction DR2.

The joint units JU may move to a predetermined portion of the first extension portion EX1. The connection portion CNP and the coupling portion COP may move to the end portion of the second extension portion EX2 adjacent to the curved portion CVP.

As shown in FIGS. 15-16, a portion of the link portion LK may overlap with the heat discharge plate RHP in the expansion mode. For example, the third portion PT3 of the third link portion LK3 may overlap with the heat discharge plate RHP. When the third portion PT3 overlaps with the heat discharge plate RHP, the branch portions BH may make contact with the protrusion portions PRT.

Figure 17:
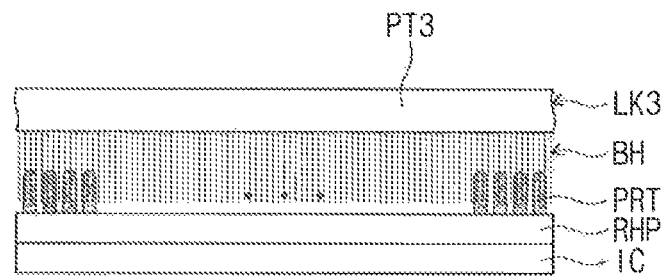
FIG. 17 is an enlarged side elevational view showing branch portions and protruding portions shown in FIG. 15 according to an exemplary embodiment of the present disclosure.

FIG. 17 is an enlarged view showing the branch portions BH and the protruding portions PRT shown in FIG. 15.

For the convenience of explanation, FIG. 17 shows the branch portions BH and the protruding portions PRT with the driving integrated circuit IC, the heat discharge plate RHP, and the third portion PT3 and other elements may be omitted.

Referring to FIG. 17, heat may be generated in the driving integrated circuit IC during the operation of the display device DD. The heat generated in the driving integrated circuit IC may be primarily discharged by the heat discharge plate RHP and the protrusion portions PRT. However, since the branch portions BH make contact with the protrusion portions PRT in the expansion mode, the heat generated in the driving integrated circuit IC may be secondarily discharged by the branch portions BH. The link portion LK may be manufactured by a metal material, and in this embodiment, the heat generated in the driving integrated circuit IC may be discharged by the branch portions BH and the link portion LK.

Consequently, the display device DD according to the exemplary embodiment of the present disclosure may efficiently discharge the heat generated in the driving integrated circuit IC.

FIGS. 18, 19 and 21 to 22 are side elevational views showing various exemplary embodiments of a heat discharge plate, branch portions, and protruding portions of the display device according to the present disclosure. FIG. 20 is a plan view showing an exemplary embodiment of a heat discharge plate according to the present disclosure.

Hereinafter, different structures of the heat discharge plate, the branch portions, and the protruding portions from those of the heat discharge plate RHP, the branch portions BH, and the protruding portions PRT shown in FIG. 17 will be mainly described.

Figure 18:
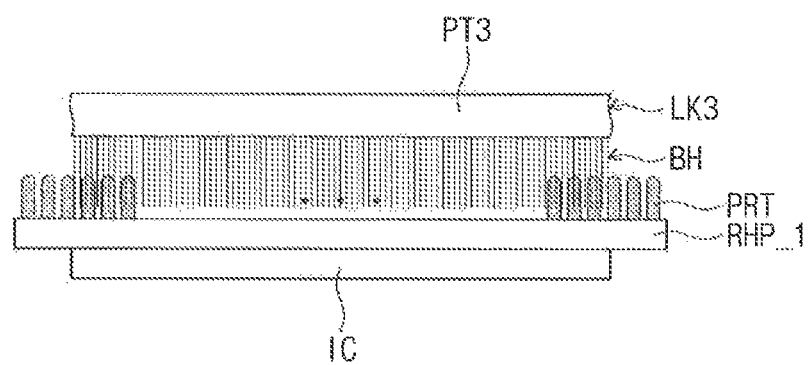
FIGS. 18, 19, 21 and 22 are enlarged side elevational views showing various embodiments of the branch portions and protruding portions according to exemplary embodiments of the present disclosure.

Referring to FIG. 18, a heat discharge plate RHP_1 may have an area greater than that of the driving integrated circuit IC. The area may indicate an area when viewed in a plan view. Since a heat discharge function is proportional to the area, the heat generated in the driving integrated circuit IC may be more efficiently discharged by the heat discharge plate RHP_1.

Figure 19:
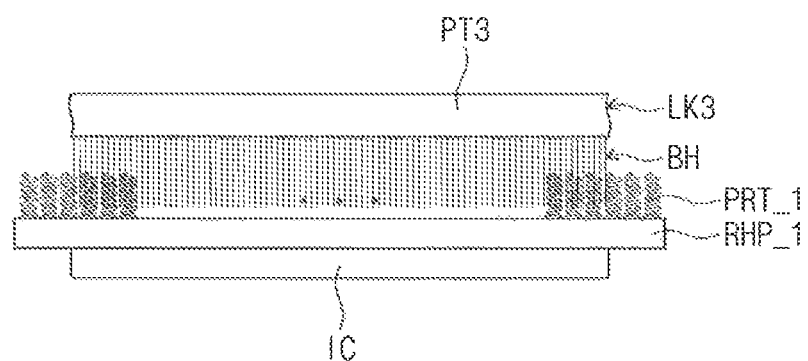
Figure 20:
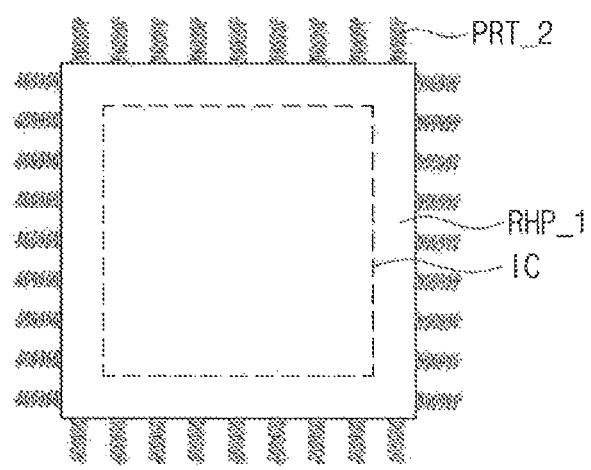
FIG. 20 is a plan view showing a heat discharge plate according to an exemplary embodiment of the present disclosure.

Referring to FIG. 19, a heat discharge plate RHP_1 may have an area greater than that of the driving integrated circuit IC, and protrusion portions PRT_1 disposed on the heat discharge plate RHP_1 may have a coil shape. A surface area of the protrusion portions PRT_1 having the coil shape may be greater than that of the protrusion portions PRT shown in FIG. 17. Accordingly, the heat generated in the driving integrated circuit IC may be more efficiently discharged by the heat discharge plate RHP_1 and the protrusion portions PRT_1.

Figure 21:
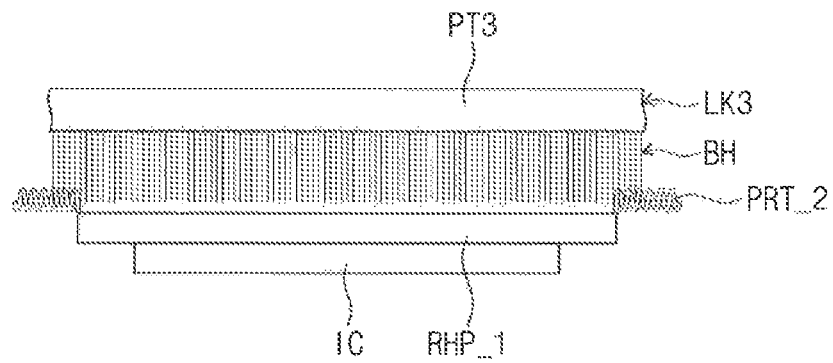

Referring to FIGS. 20 and 21, a heat discharge plate RHP_1 may have an area greater than that of the driving integrated circuit IC, and protrusion portions PRT_2 may be arranged along edges of the heat discharge plate RHP_1. The protrusion portions PRT_2 may have a coil shape and may extend in the first direction DR1 and/or the second direction DR2. The branch portions BH may make contact with the protrusion portions PRT_2.

Figure 22:
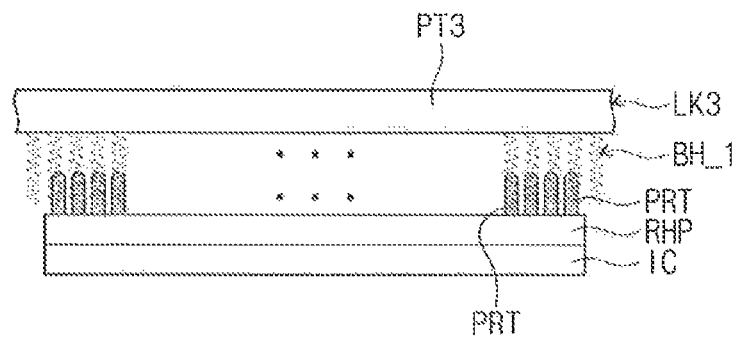

Referring to FIG. 22, branch portions BH_1 may have a coil shape and may make contact with the protrusion portions PRT. A surface area of the branch portions BH_1 having the coil shape may be greater than that of the branch portions BH shown in FIG. 17.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concept shall be determined according to the attached claims.

What is claimed is:

1. A display device comprising:
    first and second sidewall portions extending in a first direction and arranged in a second direction that crosses the first direction;
    a display module having first and second sides arranged in the first direction, the display module disposed between the first sidewall portion and the second sidewall portion and folded with respect to an axis extending in the second direction;
    a moving portion connected to the first side of the display module, the moving portion disposed between the first sidewall portion and the second sidewall portion when the display device is in a non-expanded mode;
    a link portion connected to the second side of the display module, the link portion including a plurality of branch portions extending downward;
    a driving integrated circuit disposed below the display module; and
    a heat discharge plate disposed on the driving integrated circuit,
    wherein the moving portion is configured to move in the first direction to bring the display device into an expansion mode in which the moving portion is farther displaced from the second side of the display module in the first direction than in the non-expanded mode; and
    wherein the link portion is configured to expand in the first direction when the moving portion moves in the first direction so that a portion of the link portion that includes the plurality of branch portions overlaps with the heat discharge plate in the expansion mode.

2. The display device of claim 1, further comprising a supporter configured to support the display module, wherein the link portion is connected to a portion of the supporter.

3. The display device of claim 2, wherein the link portion comprises:
    a first link portion extending in the second direction and configured to be rotated;
    a second link portion coupled to a first side of the first link portion and configured to be rotated; and
    a third link portion coupled to a second side of the first link portion and configured to be rotated;
    wherein the first link portion is configured to rotate with respect to a center of the first link portion, and the third link portion overlaps with the heat discharge plate when the moving portion moves in the first direction to bring the display device into the expansion mode.

4. The display device of claim 3, further comprising a link support portion disposed under the link portion between the first sidewall portion and the second sidewall portion,
    wherein the center of the first link portion is coupled to the link support portion.

5. The display device of claim 3, wherein the third link portion comprises:
    a first portion coupled to a portion of the supporter and a coupling portion of the display module adjacent to the second side of the display module;
    a second portion coupled to the second side of the first link portion;
    a third portion disposed between the first portion and the second portion; and
    the plurality of branch portions is disposed under the third portion.

6. The display device of claim 5, wherein a height of a lower surface of the third portion is higher than a lower surface of the first portion and a lower surface of the second portion.

7. The display device of claim 5, further comprising a pin unit configured to couple the first portion to the portion of the supporter and the coupling portion.

8. The display device of claim 5, further comprising a plurality of protrusion portions disposed on the heat discharge plate.

9. The display device of claim 8, wherein lower portions of the branch portions are configured to make contact with the protrusion portions in the expansion mode.

10. The display device of claim 8, wherein each of the branch portions has a diameter that is smaller than a diameter of each of the protrusion portions.

11. The display device of claim 8, wherein the heat discharge plate, the protrusion portions, and the branch portions comprise a metal material.

12. The display device of claim 2, wherein:
the first and second sidewall portions include guide grooves defined in inner side surfaces of the first sidewall portion and the second sidewall portion; and
the supporter includes a first side and a second side arranged in the second direction that are configured to be inserted into the guide grooves;
wherein the first and second sides of the supporter are configured to move along the guide grooves.

13. The display device of claim 12, wherein the guide grooves comprises:
a first extension portion extending in the first direction;
a second extension portion extending in the first direction that is disposed under the first extension portion, and having a length that is smaller than a length of the first extension portion; and
a curved portion extending from a first end of the first extension portion to a first end of the second extension portion and having a curved shape.

14. The display device of claim 13, wherein the supporter in the non-expanded mode comprises:
a support plate disposed on the first extension portion;
a connection portion disposed on the second extension portion; and
a plurality of joint units disposed on the curved portion and the second extension portion between the support plate and the connection portion.

15. The display device of claim 14, wherein the support plate, the joint units, and the connection portion are disposed on a lower surface of the display module.

16. The display device of claim 1, wherein the heat discharge plate has an area that is greater than an area of the driving integrated circuit when viewed in a plan view.

17. The display device of claim 1, further comprising a plurality of protrusion portions disposed on the heat discharge plate and having a coil shape.

18. The display device of claim 1, further comprising a plurality of protrusion portions disposed at an edge of the heat discharge plate and having a coil shape.

19. The display device of claim 1, wherein the plurality of branch portions has a coil shape.

20. A display device comprising:
a display module having a first side and a second side arranged in the first direction, the display module folded with respect to an axis extending in a second direction that crosses the first direction;
a moving portion connected to the first side of the display module;
a link portion connected to the second side of the display module, the second side of the display module is located lower than the first side of the display module and the moving portion, the link portion comprising a plurality of branch portions extending downward;
a driving integrated circuit disposed under the display module;
a heat discharge plate disposed on the driving integrated circuit; and
a plurality of protrusion portions disposed on the heat discharge plate, wherein when the moving portion moves in the first direction, the link portion expands in the first direction so that the branch portions make contact with the protrusion portions.

* * * * *